United States Patent
Miyazaki et al.

(10) Patent No.: US 9,229,271 B2
(45) Date of Patent: Jan. 5, 2016

(54) DISPLAY DEVICE

(71) Applicant: Japan Display Inc., Minato-ku (JP)

(72) Inventors: Kayoko Miyazaki, Tokyo (JP); Tatsuaki Kuji, Tokyo (JP); Keiji Tago, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 14/795,586

(22) Filed: Jul. 9, 2015

(65) Prior Publication Data

US 2015/0309364 A1    Oct. 29, 2015

Related U.S. Application Data

(62) Division of application No. 14/035,025, filed on Sep. 24, 2013, now Pat. No. 9,110,329.

(30) Foreign Application Priority Data

Oct. 31, 2012 (JP) ................... 2012-240302

(51) Int. Cl.
*G02F 1/1335* (2006.01)
*G02B 5/30* (2006.01)
*G02F 1/13363* (2006.01)

(52) U.S. Cl.
CPC ........ *G02F 1/133528* (2013.01); *G02B 5/3025* (2013.01); *G02F 1/13363* (2013.01); *G02F 1/133536* (2013.01); *G02F 2001/133531* (2013.01)

(58) Field of Classification Search
CPC ..................... G02F 1/133528; G02F 1/133536
See application file for complete search history.

(56) References Cited

U.S. PATENT DOCUMENTS

| | | |
|---|---|---|
| 2009/0015762 A1 | 1/2009 | Noguchi |
| 2009/0115942 A1* | 5/2009 | Watanabe ......... G02F 1/133305 349/96 |
| 2013/0077028 A1 | 3/2013 | Miyazaki et al. |

FOREIGN PATENT DOCUMENTS

JP    2006-243132    9/2006

* cited by examiner

*Primary Examiner* — Phu Vu
(74) *Attorney, Agent, or Firm* — Oblon, McClelland, Maier & Neustadt, L.L.P.

(57) ABSTRACT

A liquid crystal display panel for displaying images in an active area includes a first substrate having a pair of first short ends and first long ends. A second substrate faces the first substrate so as to hold a liquid crystal layer therebetween. A first polarization plate is arranged on an outside surface of the first substrate. The first polarization plate has a pair of second short ends longer than the first short ends, a pair of second long ends, and a first absorption axis. The angle a1 made by the first absorption axis with respect to the second short ends is smaller than an angle b1 made by the first absorption axis with respect to the second long ends. A second polarization plate is arranged on an outside surface of the second substrate and has a second absorption axis.

18 Claims, 6 Drawing Sheets

DISPLAY DEVICE

CROSS-REFERENCE TO RELATED APPLICATION

This divisional application is based upon and claims the benefit of priority from U.S. Ser. No. 14/035,025, filed Sep. 24, 2013, which claims priority from prior Japanese Patent Application No. 2012-240302 filed Oct. 31, 2012, the entire contents of each of which are incorporated herein by reference.

FIELD

Embodiments described herein relate generally to a liquid crystal display device.

BACKGROUND

A liquid crystal display device is used in various fields of OA equipments such as a personal computer and a television set, taking advantage of the features such as light weight, thin shape, and low power consumption. In recent years, the liquid crystal display device is used also as displays for a portable remote terminal such as a cellular phone and PDA (personal digital assistant), a car navigation equipment, and a game machine.

In the liquid crystal display device, a polarization plate is indispensable. Shrinkage of the polarization plate is raised as one of the points about which we are anxious in a durability viewpoint. In a liquid crystal display panel with high demand for a narrow frame, since the width of a shielded peripheral area surrounding an active area becomes narrow, a polarization plate end enters to an inner side of the active area by the shrinkage of the polarization plate. Accordingly, optical leak of the active area occurs in the peripheral area, and there is a problem of lowering display grace.

BRIEF DESCRIPTION OF THE DRAWINGS

The accompanying drawings, which are incorporated in and constitute a portion of the specification, illustrate embodiments of the invention, and together with the general description given above and the detailed description of the embodiments given below, serve to explain the principles of the invention.

DETAILED DESCRIPTION

A liquid crystal display device according to an exemplary embodiment of the present invention will now be described with reference to the accompanying drawings wherein the same or like reference numerals designate the same or corresponding portions throughout the several views.

According to one embodiment, a liquid crystal display device includes: a liquid crystal display panel for displaying images in an active area, including; a first substrate having a pair of first short ends and first long ends, a second substrate facing the first substrate, and a liquid crystal layer held between the first substrate and the second substrate, a first polarization plate arranged on an outside surface of the first substrate having a pair of second short ends longer than the first short ends, a pair of second long ends, and a first absorption axis wherein an angle a1 made by the first absorption axis with respect to the second short ends is smaller than an angle b1 made by the first absorption axis with respect to the second long ends; and a second polarization plate arranged on an outside surface of the second substrate and having a second absorption axis.

Figure 1:
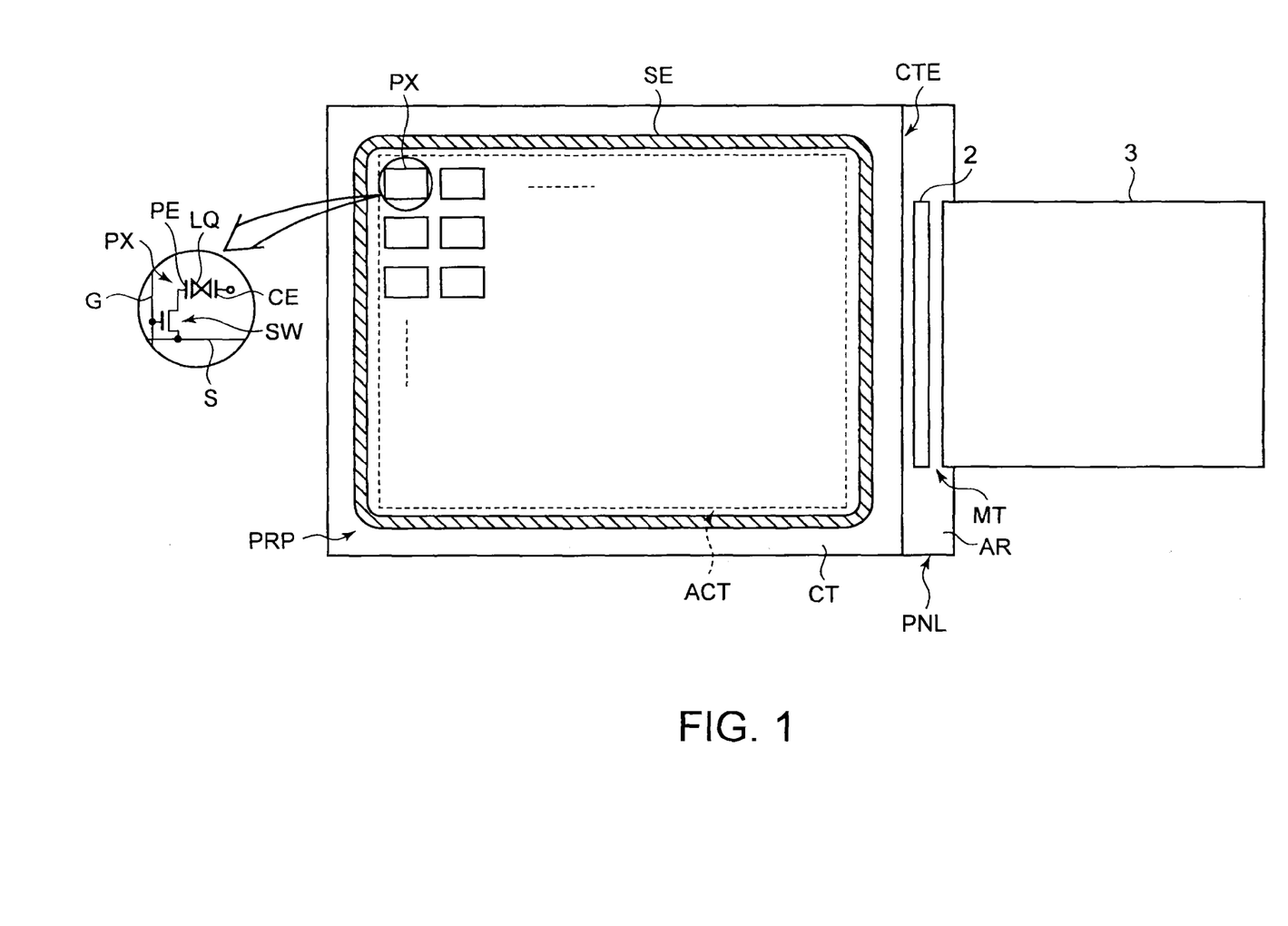
FIG. 1 is a plan view schematically showing a liquid crystal display panel PNL applicable to a liquid crystal display device according to one embodiment.

FIG. 1 is a plan view schematically showing a liquid crystal display panel PNL applicable to a liquid crystal display device according to one embodiment.

The display panel PNL is an active-matrix type liquid crystal display device equipped with an array substrate AR and a counter substrate CT arranged facing the array substrate AR, and a liquid crystal layer LQ held therebetween. The array substrate AR and the counter substrate CT are pasted together by a seal element SE while forming a predetermined cell gap between the substrates. The cell gap is formed of a pillar-shaped spacer which is formed on the array substrate AR or the counter substrate CT (not illustrated). The liquid crystal layer LQ is held on an inner side surrounded with the seal element SE in the cell gap between the array substrate AR and the counter substrate CT.

The display panel PNL is equipped with an active area ACT which displays images on the inner side surrounded with the seal element SE. The active area ACT is formed of a plurality of pixels PX in a rectangular shape by being arranged in the shape of a (m×n) matrix, for example, (here, m and n are positive integers).

The array substrate AR is equipped with a plurality of gate lines G and source lines S crossing the gate lines G, a switching element SW connected with the gate line G and the source line S, and a pixel electrode PE connected with the switching element SW, etc. Although the counter substrate CT is equipped with a counter electrode CE which faces each of the pixel electrodes PE through the liquid crystal layer LQ, for example, the array substrate AR may be equipped with the counter electrode CE.

In addition, although explanation is omitted about detailed structures of the display panel PNL, the display panel PNL is constituted so that modes which mainly use vertical electric field or oblique electric field, such as TN (Twisted Nematic) mode, OCB (Optically Compensated Bend) mode, and VA (Vertical Aligned) mode are applicable. Further, modes which mainly use lateral electric field, such as IPS (In-Plane Switching) mode and FFS (Fringe Field Switching) mode may be applicable by arranging the pixel electrode PE and the counter electrode CE on the array substrate AR.

A signal source for supplying signals required to drive the display panels PNL, such as a driving IC chip 2 and a flexible printed circuit (FPC) board 3, is arranged in the peripheral area PRP outside the active area ACT. More specifically, the array substrate AR is equipped with a mounting portion MT which extends to outside beyond a substrate end CTE of the counter substrate CT.

Figure 2:
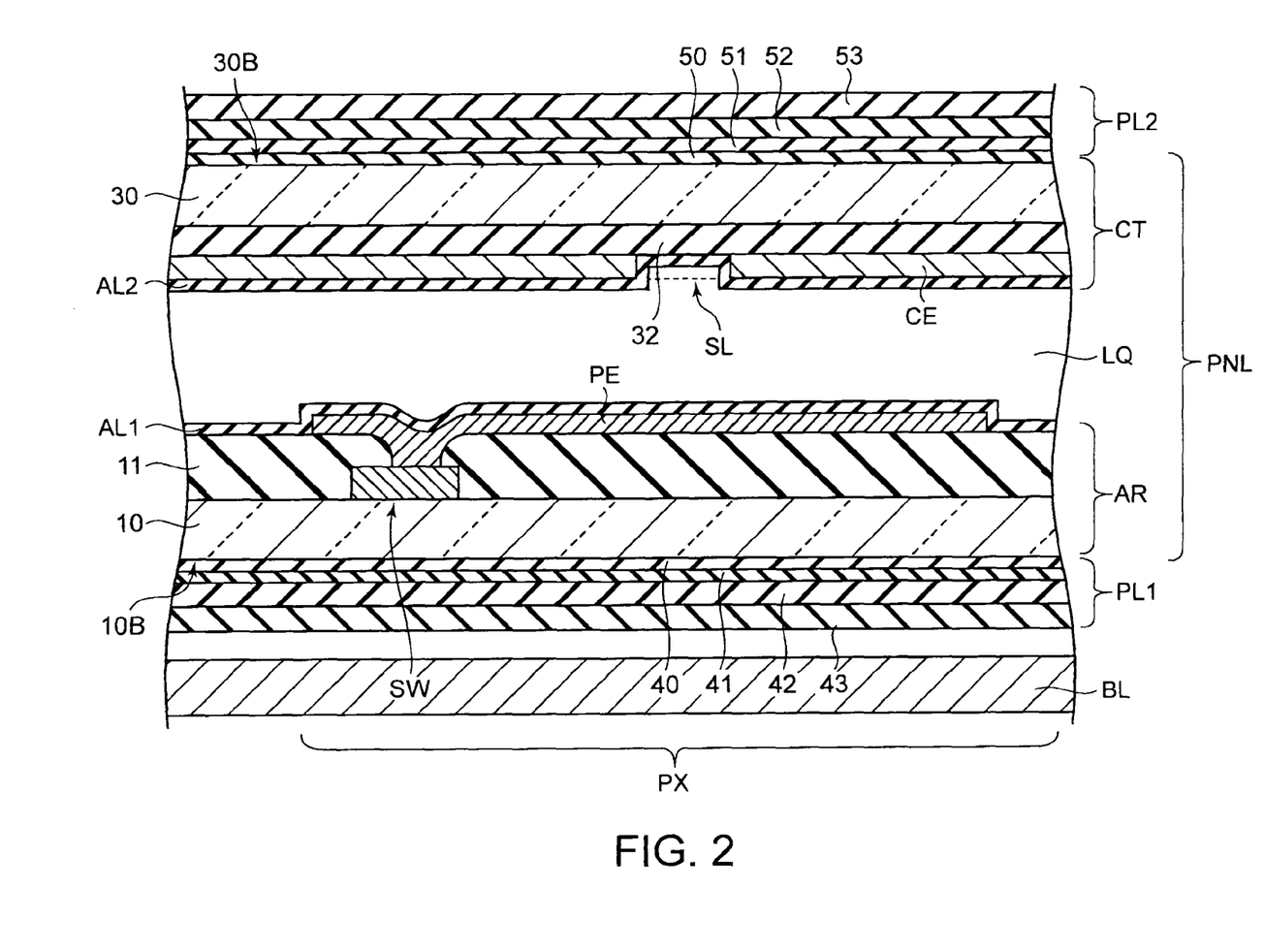
FIG. 2 is a cross-sectional view schematically showing the display panel PNL shown in FIG. 1.

FIG. 2 is a cross-sectional view schematically showing the display panel PNL shown in FIG. 1. Here, the display panel PNL using the VA mode is explained as an example.

The array substrate AR is formed using a transparent first insulating substrates 10, such as a glass substrate and a resin substrate. The array substrate AR is equipped with the switching element SW, the pixel electrode PE, and a first alignment film AL1, etc., on the first insulating substrate 10 facing the counter substrate CT. Although the switching element SW is not explained in detail, the switching element SW is constituted by a thin film transistor (TFT), for example. The switching element SW is covered with an interlayer insulation film 11. The pixel electrode PE is formed on the interlayer insulation film 11. The pixel electrode PE is formed of a transparent electric conductive material, such as Indium Tin Oxide (ITO) and Indium Zinc Oxide (IZO), for example. The pixel electrode PE is covered with the first alignment film AL1. The first alignment film AL1 is formed of material which shows vertical alignment characteristics.

On the other hand, the counter substrate CT is formed using a transparent second insulating substrates 30, such as a glass substrate and a resin substrate. The counter substrate CT is equipped with a color filter layer 32, a counter electrode CE, and a second alignment film AL2, etc., on the second insulating substrate 30 facing the array substrate AR. In addition, although not illustrated, the counter substrate CT may be further equipped with a black matrix, a transparent overcoat layer, etc. The color filter layer 32 is formed of resin materials colored in red, green, blue, etc., respectively. The counter electrode CE is formed on the color filter layer 32 facing the array substrate AR. The counter electrode CE is formed of transparent electric conductive materials, such as ITO and IZO. In order to form a plurality of domains in one PX, a control structure for alignment (for example, slit SL) is formed so as to face the pixel electrode PE in the counter electrode CE. The counter electrode CE is covered with the second alignment film AL2. The second alignment film AL2 is formed of the material which shows vertical alignment characteristics.

The array substrate AR and the counter substrate CT as mentioned above are arranged so that the first alignment film AL1 and the second alignment film AL2 face each other. At this time, a predetermined cell gap is formed between the first alignment film AL1 on the array substrate AR, and the second alignment film AL2 on the counter substrate CT by a spacer which is not illustrated. The liquid crystal layer LQ is injected in the cell gap as mentioned above.

A first polarization plate PL1 is arranged on an external surface 10B of the array substrate AR, i.e., the external surface of the first insulating substrate 10. The first polarization plate PL1 is pasted on the external surface 10B with adhesive 40. The first polarization plate PL1 is formed of a laminated layer constituted by a support body 41, a light polarizer 42, and a protection layer 43. A second polarization plate PL2 is arranged on an external surface 30B in the counter substrate CT, i.e., the external surface of the second insulating substrate 30. The second polarization plate PL2 is pasted on the external surface 30B with adhesive 50. The second polarization plate PL2 is formed of a laminated layer constituted by a support body 51, a light polarizer 52, and a protection layer 53. Between the first polarization plate PL1 and the first insulating substrate 10 or between the second polarization plate PL2 and the second insulating substrate 30, optical elements, such as a phase difference film may be provided. Moreover, the support bodies 41 and 51 and the protection layers 43 and 53 may be formed of phase difference films.

Figure 3:
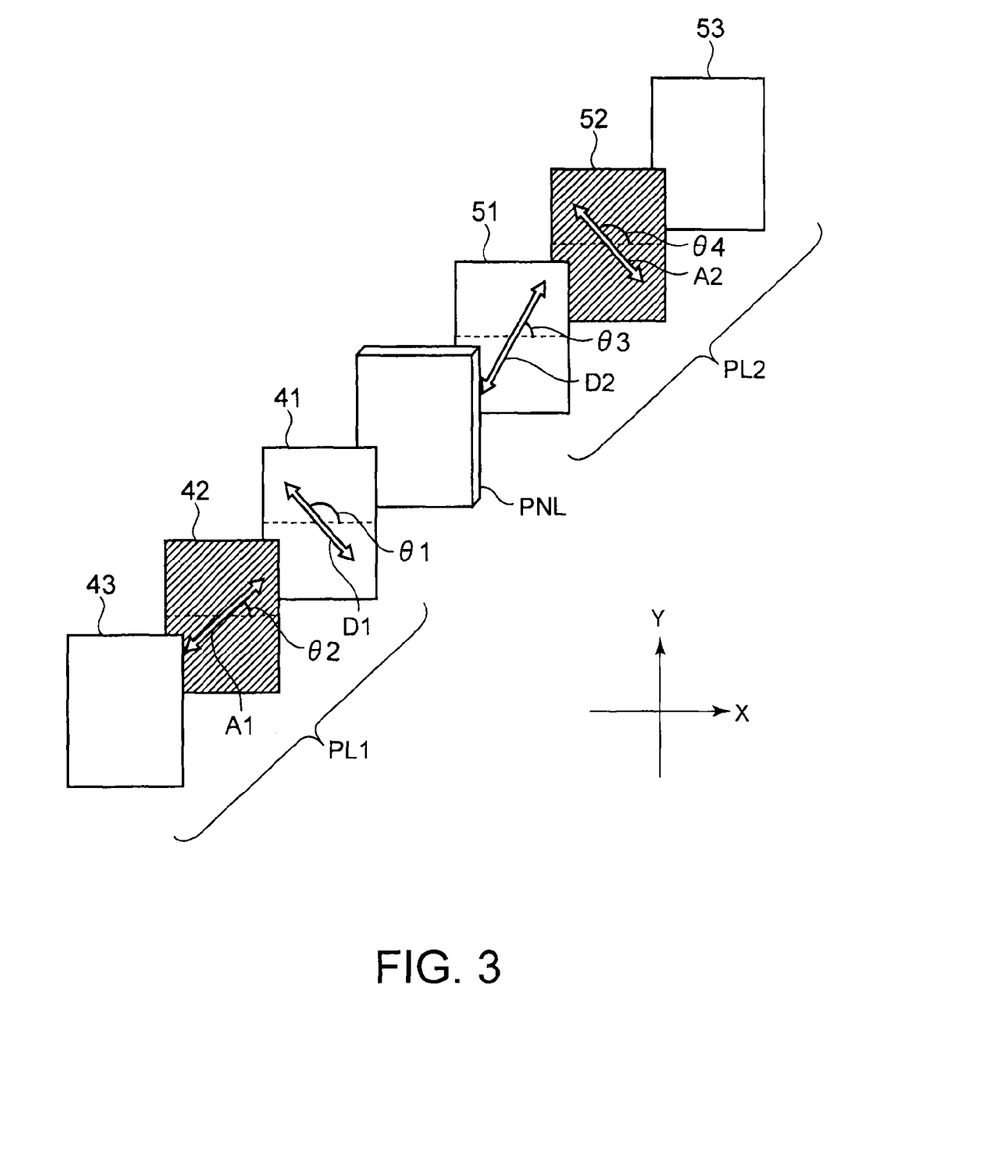
FIG. 3 is a perspective view schematically showing a first polarization plate PL1 and a second polarization plate PL2 shown in FIG. 2.

A back light BL is arranged on a side facing the array substrate AR of the display panel PNL. Various types of backlights can be used. For example, a light emitting diode (LED) and a cold cathode fluorescent lamp (CCFL), etc., can be applied as a light source of the backlight, and the explanation about its detailed structure is omitted:

FIG. 3 is a perspective view schematically showing the first polarization plate PL1 and the second polarization plate PL2 shown in FIG. 2. In addition, only composition required for explanation is illustrated here. Moreover, a direction in parallel to a short end of the display panel PNL is made into a first direction X, a direction in parallel to a long end of the display panel PNL is made into a second direction Y, and the first direction X and the second direction Y cross at right angle here.

In the first polarization plate PL1 located on a rear side of the display panel PNL, the support body 41 is formed of a phase difference film, and has a slow axis D1. The slow axis D1 crosses at an angle θ1 with respect to the first direction X. A light polarizer 42 has an absorption axis A1. The absorption axis A1 crosses at an angle θ2 with respect to the first direction X. The protection layer 43 does hardly have phase difference. That is, in the first polarization plate PL1, the light polarizer 42 is held between the support body 41 formed of the phase difference film and the protection layer 43.

In the second polarization plate PL2 located on a front side of the display panel PNL, the support body 51 is formed of the phase difference film, and has a slow axis D2. The slow axis D2 crosses at the angle θ3 with respect to the first direction X. The light polarizer 52 has an absorption axis A2. The absorption axis A2 crosses at an angle θ4 with respect to the first direction X. The protection layer 53 does hardly have the phase difference. That is, in the second polarization plate PL2, the light polarizer 52 is held between the support body 51 formed of the phase difference film and the protection layer 53.

Hereinafter, an example of an axial structure applicable to the VA mode is explained. The angle θ1 is 161°, the angle θ2 is 26°, and the slow axis D1 and the absorption axis A1 cross at 45° in a X-Y plane each other. The angle θ3 is 71°, the angle θ4 is 116°, and the slow axis D2 and the absorption axis A2 cross at 45° in the X-Y plane, respectively. Moreover, the absorption axis A1 orthogonally cross the absorption axis A2, and the slow axis D1 orthogonally cross the slow axis D2, each other.

In addition, the rear side and the front side may be replaced each other in the above-mentioned axial structure.

Next, the structure of the polarization plate applicable to this embodiment is explained.

Figure 4:
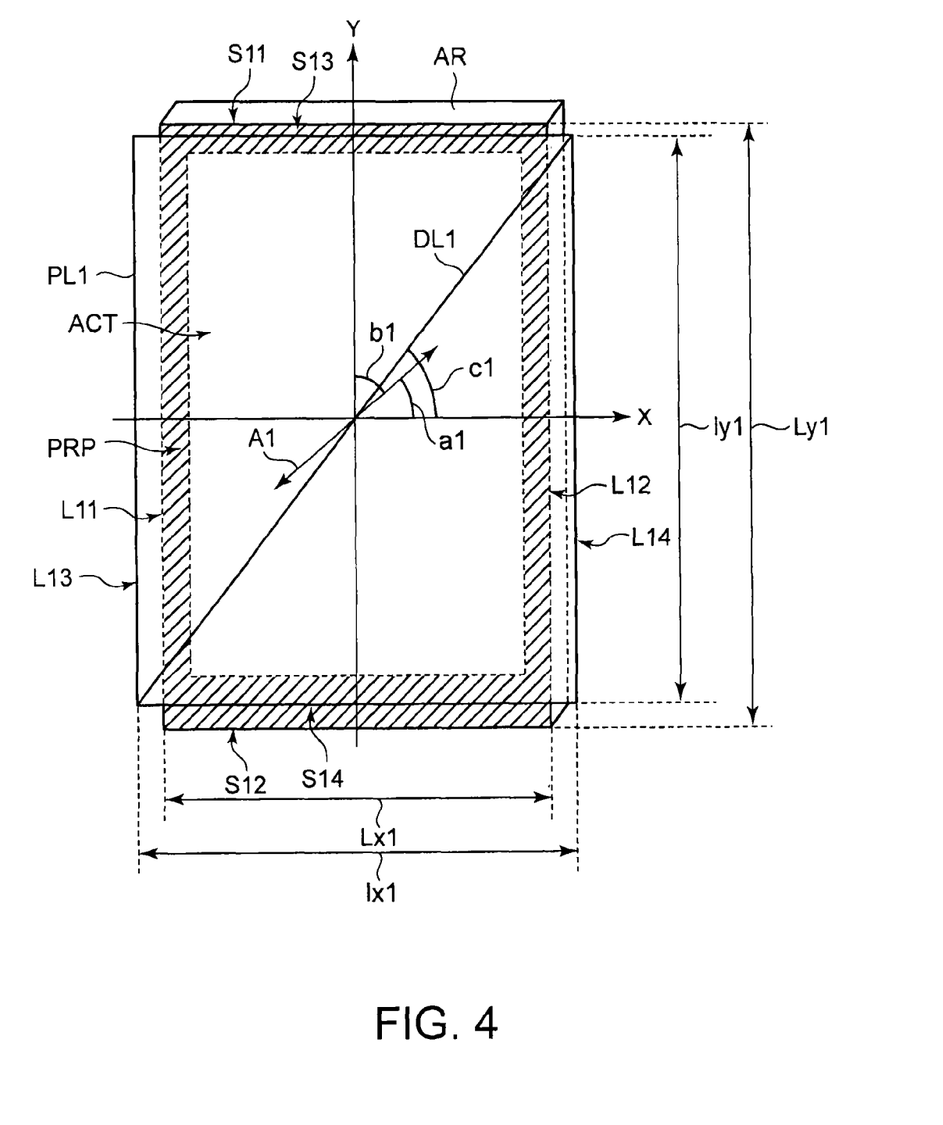
FIG. 4 is a diagram showing relation of outside size between an array substrate AR and the first polarization plate PL1.

FIG. 4 is a diagram showing relation of outside size between the array substrate AR and the first polarization plate PL1.

The array substrate AR has a pair of short ends S11 and S12 in parallel to the first direction X mutually, and a pair of long ends L11 and L12 in parallel to the second direction Y mutually, and is formed in a shape of a rectangle extending in the second direction Y in the X-Y plane. In addition, the inner side of a domain shown with a dashed line corresponds to the active area ACT, and a domain shown with a slash corresponds to the peripheral area PRP in the array substrate AR. The peripheral area PRP is a domain which does not contribute to the display, and shielded by a shield layer, etc., which is not illustrated.

The first polarization plate PL1 has a pair of short ends S13 and S14 in parallel to the first direction X mutually, and a pair of long ends L13 and L14 in parallel to the second direction Y mutually, and is formed of in the shape of a rectangle extending in the second direction Y in the X-Y plane. In the first polarization plate PL1, the angle a1 made by the short ends S13 and S14, i.e., the first direction X, with the absorption axis A1 is smaller than the angle b1 made by the long ends L13 and L14, i.e., the second direction Y, with the absorption axis A1. Moreover, in the first polarization plate PL1, the angle a1 is smaller than the angle c1 made by the short ends S13 and S14, i.e., the first direction X, with a diagonal line DL1. That is, the absorption axis A1 is in parallel to the direction which intersects the long ends L13 and L14, not the direction which intersects the short ends S13 and S14.

In the first polarization plate PL1 with above structure, the length lx1 of the short ends S13 and S14 in the first direction X is longer than the length Lx1 of the array substrate AR along the short ends S11 and S12. In the illustrated example, each of the pair of long ends L13 and L14 of the first polarization plate PL1 protrudes to outside beyond the end of the array substrate AR. That is, the long end L13 is located outside beyond the long end L11 of the array substrate AR, and the long end L14 is located outside the long end L12 of the array substrate AR. In addition, one of the pair of long ends L13 and L14 may be in a position which overlaps with the long end of the array substrate AR. For example, the long end L13 may be located in the position which overlaps with the long end L11 of the array substrate AR, and the long end L14 may be located outside the long end L12 of the array substrate AR.

In this embodiment, moreover, the length ly1 of the long ends L13 and L14 of the first polarization plate PL1 in the second direction Y is shorter than the length Ly1 of the long ends L11 and L12 of the array substrate AR in the second direction Y. Each of the pair of short ends S13 and S14 of the first polarization plate PL1 overlaps with the peripheral area PRP, and is located inside the pair of short ends S11 and S12 of the array substrate AR. In addition, one of the pair of short ends S13 and S14 may be in the position which overlaps with the short end of the array substrate AR. Also, the length ly1 may be longer than the length of the active area ACT in the second direction Y, and may be substantially equal to or longer the length Ly1.

Figure 5:
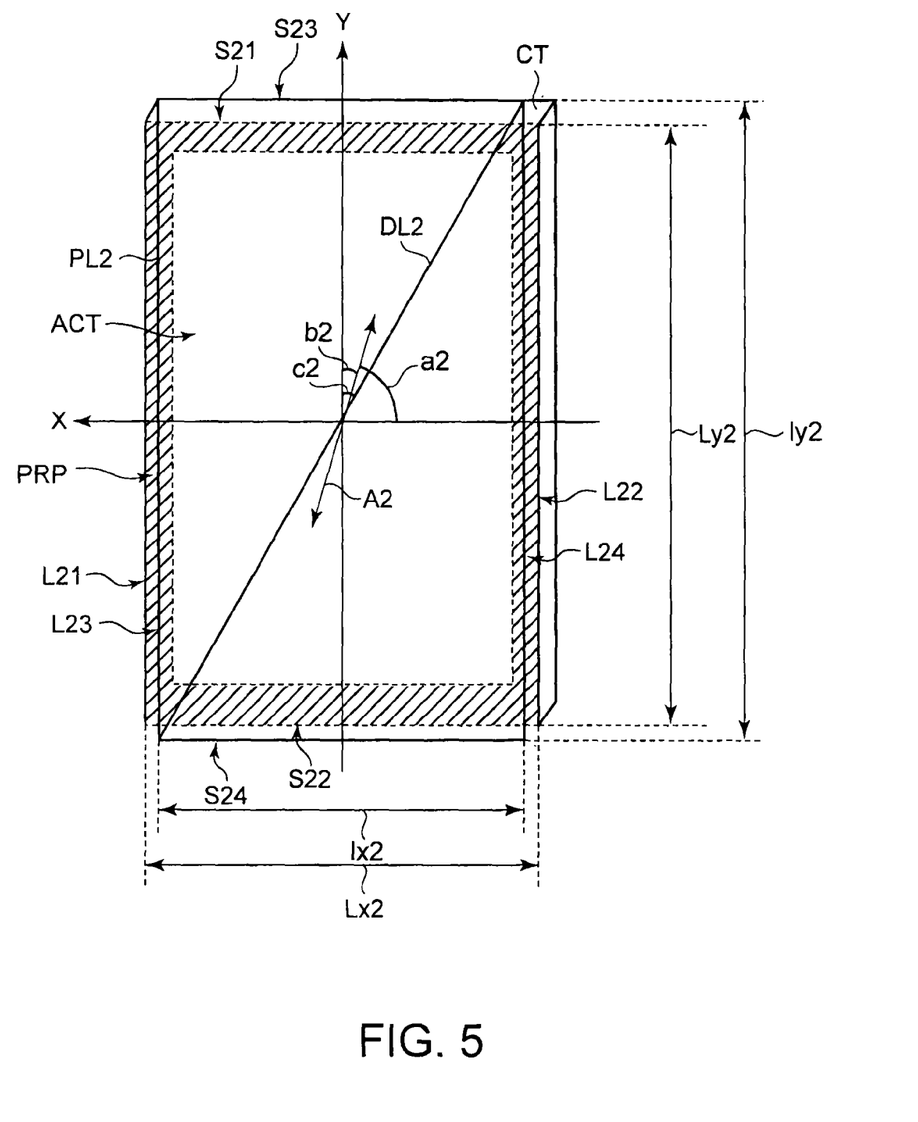
FIG. 5 is a diagram showing relation of outside size between a counter substrate CT and the second polarization plate PL2.

FIG. 5 is a diagram showing relation of outside size between the counter substrate CT and the second polarization plate PL2.

The counter substrate CT has a pair of short ends S21 and S22 in parallel to the first direction X, and a pair of long ends L21 and L22 in parallel to the second direction Y, and is formed in the shape of a rectangle extending in the second direction Y in the X-Y plane. In addition, the inner side of the domain shown with the dashed line corresponds to the active area ACT in the counter substrate CT, and the domain shown with the slash corresponds to the peripheral area PRP.

The second polarization plate PL2 includes a pair of short ends S23 and S24 in parallel to the first direction X, and a pair of long ends L23 and L24 in parallel to the second direction Y, and is formed in the shape of a rectangle extending in the second direction Y in the X-Y plane. In the second polarization plate PL2, an angle a2 made by the short ends S23 and S24, i.e., the first direction X, with respect to the absorption axis A2 is larger than an angle b2 made by the long ends L23 and L24. i.e., the second direction Y, with respect to the absorption axis A2. Moreover, in second polarization plate PL2, an angle b2 is smaller than an angle c2 made by the long ends L23 and L24, i.e., the second direction Y, with a diagonal line DL2. That is, the absorption axis A2 is in parallel to the direction which intersects the short ends S23 and S24, not the direction which intersects the long ends L23 and L24.

In the second polarization plate PL2 with above structure, the length ly2 of the long ends L23 and L24 in the second direction Y is longer than the length Ly2 of the long ends L21 and L21 of the counter substrate CT in the second direction Y. In the illustrated example, each of the pair of short ends S23 and S24 of the second polarization plate PL2 protrudes to outside the counter substrate CT. That is, the short end S23 is located outside the short end S21 of the counter substrate CT, and the short end S24 is located outside the short end S22 of the counter substrate CT, respectively. In addition, one of the pair of short ends S23 and S24 may be in the position which overlaps with the short end of the counter substrate CT. For example, the short end S23 may be located in the position which overlaps with the short end S21 of the counter substrate CT, and the short end S24 may be located outside the short end S22 of the counter substrate CT.

Moreover, in this embodiment, the length lx2 of the short ends S23 and S24 of the second polarization plate PL2 in the first direction X is shorter than the length Lx2 of the short ends S21 and S22 of the counter substrate CT in the first direction X. Each of the pair of long ends L23 and L24 of the second polarization plate PL2 overlaps with the peripheral area PRP, and is located inside the pair of long ends L21 and L22 of the counter substrate CT. In addition, one of the pair of long ends L23 and L24 may be in the position which overlaps with the long end of the counter substrate CT. Also, the length lx2 may be longer than the length of the active area ACT in the first direction X, and may be substantially equal to or longer the length Lx2.

In addition, the above first polarization plate PL1 and the second polarization plate PL2 may be replaced. At this time, the length of the first polarization plate PL1 in the first direction X is formed longer than the length of the substrate to be attached in the first direction X. Further, it is preferable that the length of the second polarization plate PL2 in the second direction Y is formed longer than the length of the substrate to be attached in the second direction Y.

The light polarizer 42 of the first polarization plate PL1 and the light polarizer 52 of the second polarization plate PL2 are formed by extending polyvinyl alcohol (PVA), and the extending direction turns into the direction of the absorption axis of the light polarizer. In the first polarization plate PL1 and the second polarization plate PL2 using the PVA, shrinkage is generated under the influence of heat. Especially, the first polarization plate PL1 and the second polarization plate PL2 tend to shrink in the extending direction of the absorption axis. The shrinkage by the polarization plate is resulted by evaporation of moisture contained in the polarization plate under high temperature environment for a long time. Even if the polarization plate is released from high temperature environment, it is an irreversible change which is not restored to the original size. Moreover, in recent years, the request for slimming down the display device is rising. The polarization plate also tends to become a thin film, and the film thickness of the support body and the protection layer which hold the light polarizer is also becoming thin. For this reason, the mechanical strength which controls shrinkage of the light polarizer by the support body or the protection layer is falling.

Even if the polarization plate shrinks, neither the long ends nor the short ends of the polarization plate enters to the position which overlaps with the active area ACT by using the larger-sized polarization plate than the outside dimension of the display panel PNL according to this embodiment. That is, even if the polarization plates shrink, it becomes possible to maintain the state where the whole active area ACT is covered with the polarization plate. For this reason, it becomes possible to prevent the generation of the optical leak in the circumference area of the active area ACT due to exposure of the active area ACT from the polarization plate. Therefore, it becomes possible to control degradation of display grace.

Like the first polarization plate PL1 shown in FIG. 4, when the angle a1 made by the absorption axis A1 with respect to the first direction X is smaller than the angle b1 made by the absorption axis A1 with respect to the second direction Y, the shrinkage of the first polarization plate PL1 becomes remarkable in the first direction X. In the first polarization plate PL1, the length lx1 in the first direction X is longer than the length Lx1 of the array substrate AR in the first direction X. For this reason, even if the first polarization plate PL1 shrinks in the first direction X, the entering of the pair of long ends L13 and L14 to the active area ACT can be suppressed.

Moreover, when one of the long ends L13 and L14 overlaps with the long end of the array substrate AR, the location of the long end may also move to the position closing to the active area ACT with the shrinkage of the first polarization plate PL1. However, the width (frame width) of the peripheral area PRP between the long end of the array substrate AR and the active area ACT is set more greatly than the shrinkage amount of the first polarization plate PL1. Accordingly, the long end of the first polarization plate PL1 which overlaps with the long end of the array substrate AR does not enter to the active area ACT with the shrinkage of the first polarization plate PL1. In addition, the shrinkage of the first polarization plate PL1 in the first direction X is equally generated in both of the long ends L13 and L14, the state in which each of the long ends L13 and L14 protrudes from the array substrate AR to outside thereof is more preferable.

Like the second polarization plate PL2 shown in FIG. 5, when the angle a2 made by the absorption axis A2 with respect to the first direction X is larger than the angle b2 made by the absorption axis A2 with respect to the second direction Y, the shrinkage of the second, polarization plate PL2 in the second direction Y becomes remarkable. In the second polarization plate PL2, the length ly2 in the second direction Y is longer than the length Ly2 of the counter substrate CT in the second direction Y. For this reason, even if the second polarization plate PL2 shrinks in the second direction Y, it becomes possible to suppress the pair of short ends S23 and S24 from entering to the active area ACT.

Moreover, when one of the short ends S23 and S24 overlaps with the short end of the counter substrate CT, the location of the short end may also move to the position closing to the active area ACT with the shrinkage of the second polarization plate PL2. However, the width (frame width) of the peripheral area PRP between the short end of the counter substrate CT and the active area ACT is set more greatly than the shrinkage amount of the second polarization plate PL2. Accordingly, the short end of the second polarization plate PL2 which overlaps with the short end of the counter substrate CT does not enter to the active area ACT with the shrinkage of the second polarization plate PL2. In addition, the shrinkage of the second polarization plate PL2 in the second direction Y is equally generated on the both sides of the short ends S23 and S24, the state in which each of the short ends S23 and S24 protrudes from the counter substrate CT to outside thereof is more preferable.

Next, one practical example of the embodiment is described.

In the display panel PNL, the cell gap holding the liquid crystal layer xLQ is 3 μm, refractive-index anisotropy Δn of the liquid crystal layer LQ is 0.1, and the liquid crystal molecules are vertically aligned. The support body 41 of the first polarization plate PL1 and the support body 51 of the second polarization plate PL2 are formed of biaxial phase difference films, respectively, and the value of Nz coefficient is approximately 1.6. The axial structures of the first polarization plate PL1 and the second polarization plate PL2 are the same as the embodiment explained with reference to FIG. 3.

In the first polarization plate PL1, the angle a1 made by the absorption axis A1 with respect to the first direction X is smaller than the angle b1 made by the absorption axis A1 with respect to the second direction Y as shown in FIG. 4, and the short end size lx1 is larger than the outside size of the display panel PNL, i.e., the short end size Lx1 of the array substrate AR. Like the embodiment shown in FIG. 5, in the second polarization plate PL2, the angle a2 made by the absorption axis A2 with the first direction X is larger than the angle b2 made by the absorption axis A2 with the second direction Y. Further, the long end size Ly2 is larger than the outside size of the display panel PNL, i.e., the long end size Ly2 of the counter substrate CT. When the first polarization plate PL1 and the second polarization plate PL2 are pasted on the display panel PNL and left under high temperature environment for a long time, shrinkage of the first polarization plate PL1 and the second polarization plate PL2 was perceived. However, the optical leak in the active area ACT was not detected. Moreover, it was checked that neither the polarization plate PL1 nor the polarization plate PL2 exfoliated from the display panel PNL Next, other embodiment is explained.

Figure 6:
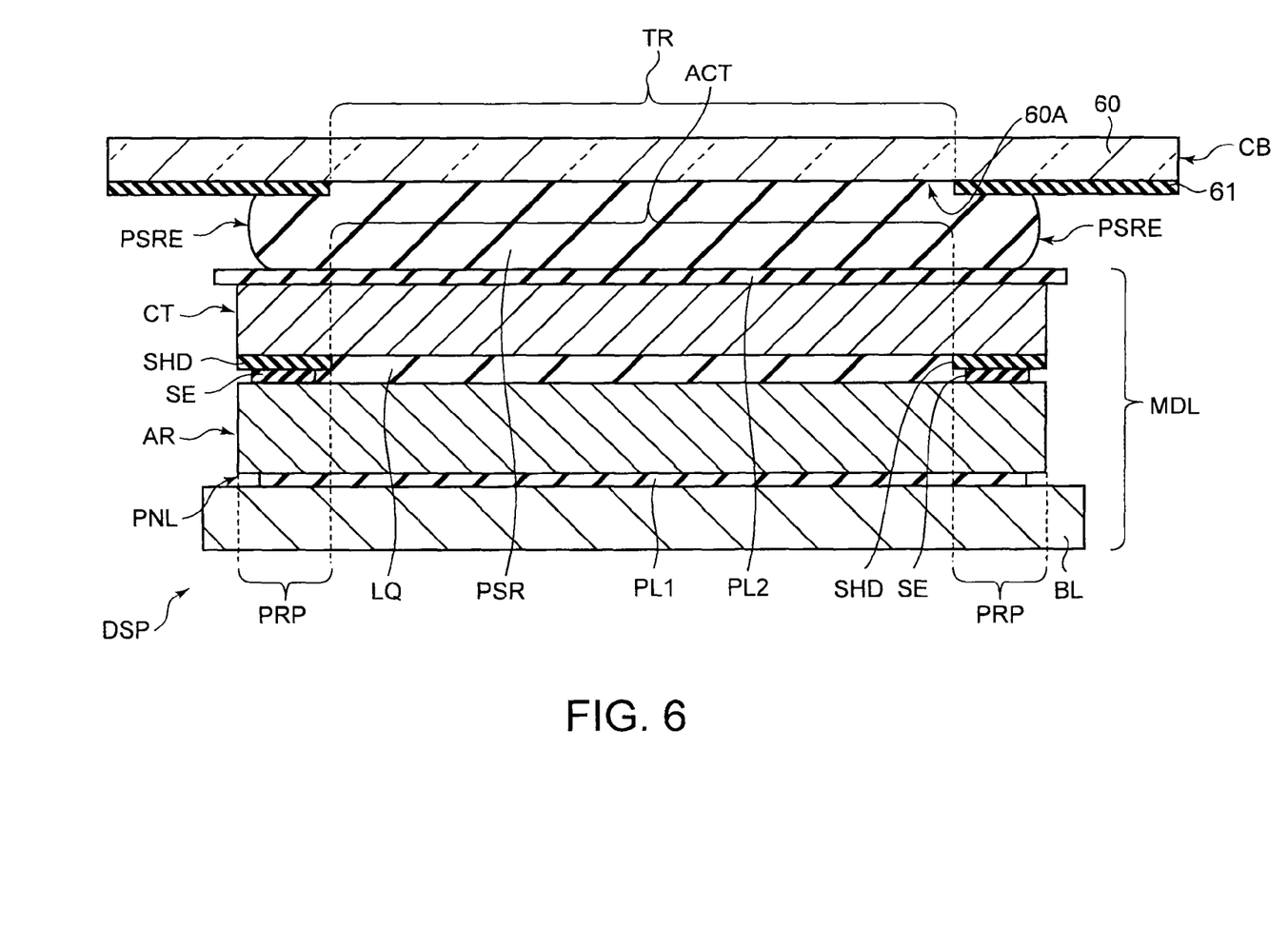
FIG. 6 is a cross-sectional view schematically showing the liquid crystal display device DSP equipped with the display panel PNL shown in FIG. 1.

FIG. 6 is a cross-sectional view schematically showing the liquid crystal display device DSP equipped with the display panel PNL shown in FIG. 1.

The display device DSP is equipped with a display module MDL for displaying images in the active area ACT, a cover element CB arranged facing the display module MDL and a transparent resin PSR which pastes together the display module MDL and the cover component CB. In this embodiment, the display module MDL is equipped with the display panel PNL and the back light BL.

The display panel PNL holds the liquid crystal layer LQ between the array substrate AR and the counter substrate CT. The array substrate AR and the counter substrate CT are pasted together by the seal material SE. Detailed explanation is omitted about the inside structure of the array substrate AR facing the counter substrate CT. The first polarization plate PL1 is pasted on the external surface of the array substrate AR facing the back light BL. The first polarization plate PL1 is arranged on the whole active area ACT. Although detailed explanation about the structure inside the counter substrate CT facing the array substrate AR is omitted, a circumference shield layer SHD is formed in the circumference of the active area ACT. The circumference shield layer SHD is arranged in the peripheral area PRP of the display panel PNL, and formed in the shape of a rectangular frame. The second polarization plate PL2 is pasted on the external surface of the counter substrate CT facing the cover element CB. The second polarization plate PL2 is arranged on the whole active area ACT.

The cover element CB faces the second polarization plate PL2. The cover element CB is equipped with a transparent base material 60 and a shield layer 61. The base material 60 is formed of a transparent glass plate, a plastic plate, etc. The shield layer 61 is arranged in an inside surface 60A of the base material 60 facing the display module MDL in the peripheral portion. The inner side surrounded with the shield layer 61 serves as a penetration portion TR. The penetration portion TR counters with the active area ACT.

The resin PSR is arranged between the surface of the display module MDL, i.e., the second polarization plate PL, and the cover element CB so as to paste together. If the variation in the amount of supplied resin PSR and suppression of air bubbles, etc., are considered, it is difficult to form the resin PSR only in the active area ACT by limiting the formation area, and the formation area necessarily extends to outside of the active area ACT. For this reason, an edge PSRE of the resin PSR is located outside the active area ACT, and faces the shield layer 61.

In this embodiment, since the second polarization plate PL2 is pasted to the cover element CB with the resin PSR, even if the second polarization plate PL2 is left under high temperature environment, the shrinkage of the second polarization plate PL2 can be controlled. For this reason, it is not necessary to make the second polarization plate PL2 larger than the outside size of the counter substrate CT. That is, in the case of the above embodiment, at least the first polarization plate PL1 pasted on the array substrate AR may be formed more greatly than the outside size of the array substrate AR.

As explained above, according to the embodiments, the liquid crystal display device which can control degradation of display grace can be supplied.

While certain embodiments have been described, these embodiments have been presented by way of embodiment only, and are not intended to limit the scope of the inventions. In practice, the structural elements can be modified without departing from the spirit of the invention. Various embodiments can be made by properly combining the structural elements disclosed in the embodiments. For embodiment, some structural elements may be omitted from all the structural elements disclosed in the embodiments. Furthermore, the structural elements in different embodiments may properly be combined. The accompanying claims and their equivalents are intended to cover such forms or modifications as would fall within the scope and spirit of the inventions.

What is claimed is:

1. A display device, comprising:
  a display panel for displaying images in an active area, including:
    a first substrate having a pair of first short sides and first long sides, and
    a second substrate facing the first substrate;
  a first polarization plate arranged on the first substrate having a pair of second short sides longer than the first short sides and a pair of second long sides; and
  a second polarization plate arranged on the second substrate;
  wherein each of the pair of second long sides protrudes from a first substrate side to outside.

2. The display device according to claim 1, wherein at least one of the first and second polarization plates includes a light polarizer held between a phase difference film and a protection film.

3. The display device according to claim 1, wherein the first substrate is formed of an array substrate, and the second substrate is formed of a counter substrate.

4. The display device according to claim 1, wherein a cover element is attached to the second polarization plate interposing a resin layer, and an outside size of the second polarization plate is equal to or smaller than an outside size of the second substrate.

5. The display device according to claim 1, wherein an outside size of the first polarization plate is bigger than an outside size of the first substrate.

6. A display device, comprising:
  a display panel for displaying images in an active area, including:
    a first substrate having a pair of first short sides and first long sides, and
    a second substrate facing the first substrate;
  a first polarization plate arranged on the first substrate; and
  a second polarization plate arranged on the second substrate and having a pair of second short sides and a pair of second long sides,
  wherein each of the pair of second short sides protrudes from a second substrate side to outside.

7. The display device according to claim 6, wherein at least one of the first and second polarization plates includes a light polarizer held between a phase difference film and a protection film.

8. The display device according to claim 6, wherein the first substrate is formed of a counter substrate, and the second substrate is formed of an array substrate.

9. The display device according to claim 6, wherein a cover element is attached to the second polarization plate interposing a resin layer, and an outside size of the second polarization plate is equal to or smaller than an outside size of the second substrate.

10. The display device according to claim 6, wherein an outside size of the second polarization plate is bigger than an outside size of the second substrate.

11. A display device, comprising:
  a pair of substrates including a first substrate and a second substrate having two pair of substrate ends, respectively;
  a first polarization plate arranged on the first substrate,
  a second polarization plate arranged on the second substrate, and
  a cover element arranged on the second polarization plate, wherein
  the first and second polarization plates having four sides, respectively,
  at least two sides of one of the first and second polarization plates protrude from a pair of substrate ends to outside, and
  each of the four sides of the first and second polarization plates is inside of an end of the cover element.

12. The display device according to claim 11, wherein the cover element is attached to the second polarization plate interposing a resin layer, and the side of the second polarization plate is arranged on the inner side of an end of the resin layer.

13. The display device according to claim 11, wherein the first polarization plate has a pair of first long sides and a pair of first short sides, and each of the pair of first long sides protrudes from the first substrate ends to outside, respectively.

14. The display device according to claim 11, wherein the second polarization plate has a pair of second long sides and a pair of second short sides, and each of the pair of second short sides protrudes from the second substrate ends to outside.

15. The display device according to claim 11, wherein at least one of the first and second polarization plates includes a light polarizer held between a phase difference film and a protection film.

16. The display device according to claim 11, wherein the first substrate is formed of an array substrate, and the second substrate is formed of a counter substrate.

17. The display device according to claim 11, wherein an outside size of the first polarization plate is bigger than an outside size of the first substrate.

18. The display device according to claim 11, wherein an outside size of the second polarization plate is bigger than an outside size of the second substrate.

* * * * *